United States Patent [19]

Shih et al.

[11] Patent Number: 5,091,759
[45] Date of Patent: Feb. 25, 1992

[54] HETEROSTRUCTURE FIELD EFFECT TRANSISTOR

[75] Inventors: Hung-Dah Shih, Plano; Bumman Kim, Richardson, both of Tex.

[73] Assignee: Texas Instruments Incorporated, Dallas, Tex.

[21] Appl. No.: 618,005

[22] Filed: Nov. 26, 1990

Related U.S. Application Data

[63] Continuation of Ser. No. 428,423, Oct. 30, 1989, abandoned, which is a continuation of Ser. No. 213,551, Jun. 30, 1988, abandoned.

[51] Int. Cl.$^5$ ............... H01L 27/12; H01L 29/161; H01L 29/80
[52] U.S. Cl. ........................... 357/22; 357/4; 357/16
[58] Field of Search ............ 357/22, 4.22, 26

[56] References Cited

U.S. PATENT DOCUMENTS

| | | | |
|---|---|---|---|
| 4,157,556 | 6/1979 | Decker et al. | 357/22 |
| 4,163,237 | 7/1979 | Dingle et al. | 357/22 |
| 4,410,902 | 10/1983 | Malik | 357/4 |
| 4,511,408 | 4/1985 | Holonyak, Jr. | 357/91 |
| 4,558,337 | 12/1985 | Saunier . | |
| 4,652,896 | 3/2487 | Das et al. | 357/22 |
| 4,691,215 | 9/1987 | Luryi | 357/16 |
| 4,733,283 | 3/1988 | Kuroda | 357/22 |
| 4,745,447 | 5/1988 | Chen et al. | 357/22 |
| 4,862,228 | 6/1989 | Ralph | 357/22 |
| 4,980,732 | 12/1990 | Hida | 357/22 |

FOREIGN PATENT DOCUMENTS

| | | | |
|---|---|---|---|
| 59-31072 | 2/1984 | Japan . | |
| 59-222966 | 12/1984 | Japan . | |
| 60-144979 | 7/1985 | Japan . | |
| 61-7666 | of 1986 | Japan | 357/22 |
| 61-158183 | of 1986 | Japan | 357/22 |
| 63-90861 | 4/1988 | Japan | 357/4 |

OTHER PUBLICATIONS

A. W. Swanson, *Micromodes & RF* (Mar. 1987) pp. 239, 140, 142, 144, 146, 148, 150.
B. Kim et al., "GaAs Power MESFET with 41-Percent Power-Added Efficiency at 35 GHz", *IEEE Electron Device Letters*, vol. 9 (Feb. 1988) pp. 57-58.
A. W. Swanson, "Millimeter-Wave Transistor-The Pseudomorphic AEMT", *Microwaves & RF (Mar. 1987)* pp. 139-150.
E. R. Schubert et al., "Selectively $\delta$-Doped $Al_xGa_{1-x}$As/GaAs heterostructures with high two-dimensional electron-gas concentrations $\eta_{2DEG} > 1.5 \times 10^{12}$ cm$^2$ for field-effect transistors", *Applied Physics Letters*, vol. 52 (12 Oct. 1987) pp. 1170-1172.
S. Judaprawira et al. "Mod-Doped MBE GaAs/nAL$_x$Ga$_{1-x}$As MESFETS", IEEE Elec. Dev. Lett., vol. EDL-2, #1, 1-81, pp. 14-15.
Barnard et al., Double Heterostructure Ga$_{0.47}$In$_{0.53}$ As MESFETS with Submicron Gates, IEEE Elec. Dev. Lett., vol. EDL-1 No. 9, 9-80, pp. 174-176.
B. F. Schubert, "The Delta-Doped Field Effect Transistor ($\delta$FET)" *IEEE Transactions of Electron Devices*, vol. ED-33 (May 19, 1986) pp. 625-632.

*Primary Examiner*—J. Carroll
*Attorney, Agent, or Firm*—Melvin Sharp; James T. Comfort; N. Rhys Merrett

[57] ABSTRACT

A heterostructure field effect transistor having a buffer layer comprising a first compound semiconductor material. A layer of second semiconductor material different from the first material is formed over the buffer layer. The second layer has a total thickness less than 250 Å. A doped third semiconductor layer formed over the second layer. The net has a dopant concentration in the second layer is greater than the net dopant concentration in the third layer. A gate layer is positioned over the third layer. In a preferred embodiment the second layer is a pulse-doped pseudeomorphic material. There is also provided a method for making the heterostructure field effect transistor. A doped pseudomorphic semiconductor layer of a first conductivity type is formed between first and second other semiconductor layers, the second layer including a net dopant concentration of the first conductivity type. A Schottky gate electrode is formed in contact with the second layer.

12 Claims, 3 Drawing Sheets

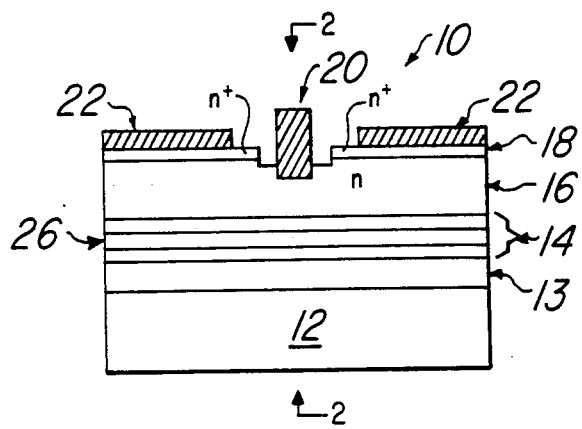
Fig. 1
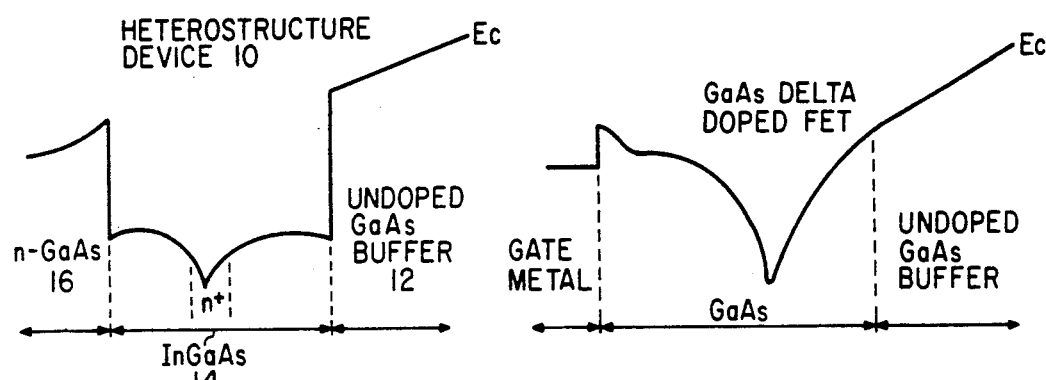
Fig. 2a
Fig. 2b PRIOR ART
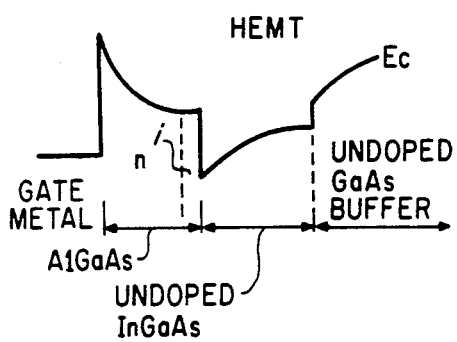
Fig. 2c PRIOR ART
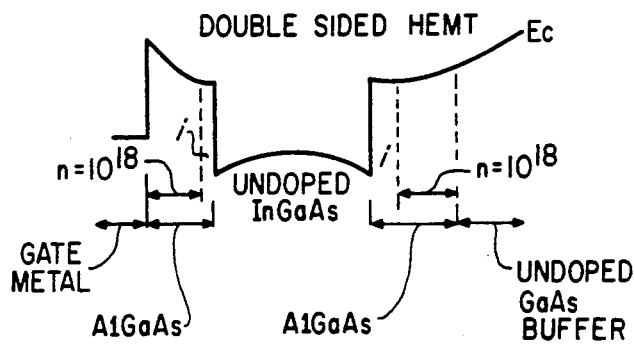
Fig. 2d PRIOR ART

HETEROSTRUCTURE FIELD EFFECT TRANSISTOR

STATEMENT AS TO RIGHTS TO INVENTIONS MADE UNDER FEDERALLY SPONSORED RESEARCH AND DEVELOPMENT

The U.S. Government has a paid-up license in this invention and the right in limited circumstances to require the patent owner to license others on reasonable terms as provided for by the terms of Contract No. F33615-85-C-1830 awarded by the Air Force Systems Command.

This application is a continuation, of application Ser. No. 07/428,423, filed Oct. 30, 1989, abandoned, which is a continuation of Ser. No. 07/213,551 filed June 30, 1988, abandoned.

FIELD OF THE INVENTION

The present invention relates to electronic semiconductor devices and, more particularly, to high frequency field effect power transistors.

BACKGROUND OF THE INVENTION

Continuing efforts are being made to improve the performance of field effect transistors (FETs) for microwave applications. Candidates for future high speed power transistors include metal semiconductor field effect transistors (MESFETS) comprising group III-V compound semiconductor materials, e.g., GaAs, AlGaAs or InGaAs, and having double recessed gates to minimize the effects of surface charge.

High electron mobility transistors (HEMTs) are among the fastest microwave power transistors. Low noise performance at high frequencies has been demonstrated with these devices at low temperatures, e.g., 77 degrees K. as well as at room temperature. High transconductance of the HEMT design has been attributed to the relatively thin (less than 100 Å) conduction channel layer, commonly referred to as a two dimensional electron gas (2DEG), which results from a conduction band discontinuity at the interface of a selectively doped heterostructure. For example, in a n-AlGaAs/GaAs heterostructure silicon doped $Al_xGa_{(1-x)}As$ (X=0.3) is deposited by molecular beam epitaxy over an undoped layer of GaAs. Because the 2DEG layer is confined to a potential well in the undoped GaAs layer, high electron mobilities are observed.

In order to improve low temperature HEMT performance and avoid formation of DX centers in the $Al_xGa_{(1-x)}As$ layer the mole fraction of Al must be reduced to less than 18 percent. Because this effectively limits the conduction band gap between the $Al_xGa_{(1-x)}As$ layer and the GaAs layer, InGaAs, having a lower conduction band than GaAs, is chosen as the 2DEG channel material. This allows for a reduction in the mole fraction of Al present in the AlGaAs, e.g., X=0.15. Lattice mismatch is minimized by forming a relatively thin, e.g., 200 Å, layer of $In_yGa_{(1-y)}As$ (Y=0.15) between the doped AlGaAs and an undoped GaAs buffer layer. This MESFET is termed a pseudomorphic HEMT because lattice strain causes the InGaAs layer to distort from a cubic structure to match the lattice constants of each adjacent layer. For further discussion see Swanson, "The pseudomorphic HEMT", *Microwaves and RF* (March 1987) beginning at page 139.

Although pseudomorphic HEMTs exhibit better high frequency operating characteristics, e.g., 0.43 W/mm at 62 GHz, than other FETs, such performance requires formation of a sharp material transition at the heterostructure interface in order to transfer a large number of electrons into the channel region. In addition, a very thin, e.g., 20–30 Å, undoped AlGaAs layer must isolate the heavily doped AlGaAs from the undoped GaAs. Otherwise dopants can easily outdiffuse into the 2DEG region and cause impurity scattering. While stringent requirements such as these can be met in a prototype laboratory environment, i.e., with carefully controlled molecular beam epitaxy techniques, repeatability and uniformity problems must be overcome in order for the device to be manufactured on a monolithic microwave integrated circuit (MMIC) structure or in a volume production environment. Even with metal-organic chemical vapor deposition (MOCVD), it is difficult to abruptly control gas flows in order to repeatably form sharp heterostructure interfaces and thin layers of uniform thickness.

It has been demonstrated that the performance of sub-half-micrometer gate MESFETs can be enhanced by incorporating extremely heavily doped active layers. See Kim et al., "GaAs Power MESFET with 41-Percent Power-Added Efficiency at 35 GHz", *I.E.E.E. Electron Device Letters*, Vol. 9, No. 2 (Feb. 1988). See also Dämbkes et al., "Improved Performance of Micron and Submicron Gate GaAs MESFETS Due to High Electron Concentrations ($n=10^{18}$ cm$^{-3}$) in the Channel," 1983 *GaAs IC Symposium Digest*, beginning at page 153.

Schubert et al. have proposed a delta doped MESFET ($\delta$ FET) composed entirely of GaAs and having a Dirac-delta-function-like profile. See "The Delta-Doped Field-Effect Transistor ($\delta$ FET)", *IEEE Transactions On Electron Devices*, Vol. ED-33, No. 5, pp. 625–632, (May 1986). This results in a V-shaped conduction band suitable for confining carrier electrons at a density exceeding $10^{18}$ cm$^{-3}$. Theoretically, the impurity layer can be confined to a lattice constant while the electron distribution extends over several lattice constants. In fact, because device operation is in the high field saturation region, formation of such a sharp dopant profile may have a more significant effect on short gate, e.g., 0.25 $\mu$m, FET performance than low field mobility characteristics. However, due to high field electron velocity limitations in the GaAs channel region, high frequency performance, e.g., 60 GHz or higher, has not been attainable with pulse-doped GaAs power MESFETs. That is, a gate length on the order of approximately 0.1 $\mu$m would be required in order to offset the material limitations of GaAs and thereby provide 60 GHz operation.

SUMMARY OF THE INVENTION

It is therefore desirable to form a millimeter wave transistor device having a cut off frequency comparable to or better than that of a HEMT, but which does not require the complex manufacturing processes associated with production of pseudomorphic HEMTs.

According to one form of the invention there is provided a field effect transistor having a buffer layer comprising a first compound semiconductor material. A layer of second semiconductor material different from the first material is formed over the buffer layer. The second layer has a total thickness less than 250 Å. A doped third semiconductor layer is formed over the second layer. The net dopant concentration in the second layer exceeds the net dopant concentration in the third layer. A gate layer is positioned over the third layer.

The second layer results in high power characteristics by increasing both the dopant concentration and the high field electron velocity over conventional MESFETs.

There is also provided a method for making a field effect transistor. A doped pseudomorphic semiconductor layer of a first conductivity type is formed between first and second other semiconductor layers, the second layer including a net dopant concentration of the first conductivity type. A schottky gate electrode is formed in contact with the second layer.

BRIEF DESCRIPTION OF THE DRAWINGS

The invention may best be understood by reference to the following detailed description of illustrative embodiments when read in conjunction with the accompanying drawing, wherein:

FIG. 1 illustrates in a schematic cross sectional elevation view a heterostructure device according to the present invention;

FIG. 2A presents the conduction band diagram for a device constructed according to the present invention and FIGS. 2B, 2C and 2D presents conduction band diagrams for various prior art devices;

Figure 3A:
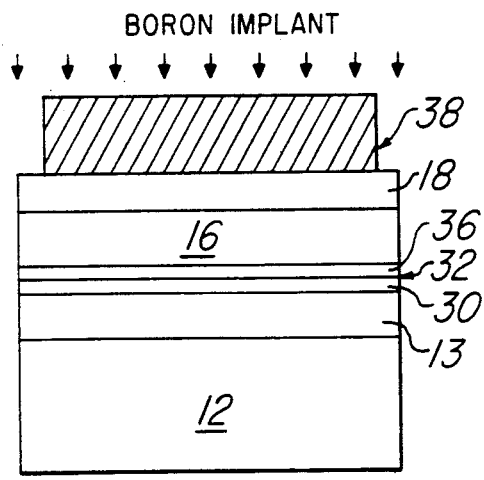
FIGS. 3A and 3B illustrate intermediate structure obtained during a first preferred method for fabricating a heterostructure device according to the present invention.

Certain preferred embodiments of the invention are described herein. However, it should be appreciated that the present invention is applicable to field effect transistors generally, and can be formed from a variety of materials depending on the particular circuit applications. The specific semiconductor materials which are disclosed are merely illustrative of ways to embody the invention and do not limit the scope of the invention. It is also recognized that the invention can be formed with a wide variety of dopants as well as impurities of opposite conductivity type to that which is illustrated.

DESCRIPTION OF THE PREFERRED EMBODIMENTS

Although the performance of GaAs MESFETs has been improved significantly by using extremely heavily doped active layers, it is now apparent that further improvement can be obtained by forming a heterostructure device which does not operate as a HEMT. FIG. 1 is a schematic cross sectional elevation view of a first preferred embodiment heterostructure device, generally denoted by reference numeral 10, according to the present invention. The device 10 includes a semi-insulating GaAs substrate 12, a 1 $\mu$m thick undoped GaAs buffer layer 13; a thin (150 Å) and heavily doped $In_xGa_{(1-x)}As$ layer 14; an n-type GaAs layer 16 doped to approximately $10^{17}$ cm$^{-3}$; a second n-type GaAs layer 18 doped to approximately $10^{18}$ cm$^{-3}$; a 0.25 $\mu$m long Ti/Pt/Au double recessed gate 20; and n+ source and drain ohmic contacts 22 over layer 18, each formed as a gold:germanium/nickel/gold structure. A 500 Å $Si_3N_4$ passivation layer (not illustrated) is formed overall.

In the preferred embodiment, X=0.15 for the layer 14 and the sheet carrier level, ranging from $3\times10^{12}$ cm$^{-2}$ to $5\times10^{12}$ cm$^{-2}$, is localized in a mid-level region 26 approximately 50 Å thick. This provides a conduction channel dopant concentration about the region 26 on the order of $10^{19}$ cm$^{-3}$. The structure results in a GaAs/InGaAs/GaAs pseudomorphic quantum well which confines the carriers to the relatively high mobility InGaAs layer 14.

The heterostructure delta doped device 10 provides improved operation over the GaAs $\delta$ FET and is comparable to or better than a pseudomorphic HEMT having a double sided doped well. FIGS. 2A–2D illustrate, respectively, energy diagrams of the conduction band level across the channel region for each device type, i.e., FIG. 2A qualitatively presents the conduction band energy level along line 2—2 of FIG. 1 and FIGS. 2B through 2D provide analogous representations for the prior art devices. For comparative purposes the GaAs channel region of the FIG. 2B $\delta$ FET includes a silicon dopant concentration of $10^{19}$ cm$^{-3}$ (based on a delta-doped layer with a sheet carrier density ranging between $10^{12}$ and $10^{13}$ cm$^{-2}$); and the pseudomorphic HEMT devices of FIGS. 2C and 2D are assumed to comprise InGaAs layers having the same stoichiometry as the device 10.

The heterostructure device 10 is characterized by a heavily doped high mobility InGaAs channel layer. Measurements indicate $\mu_n=3500$ cm$^2$(V-Sec.)$^{-1}$, approximately, at 77 degrees K. for a silicon dopant concentration of $10^{19}$ cm$^{-3}$. In contrast, the mobility level in the GaAs channel region of the FIG. 2B $\delta$ FET is 2000 cm$^2$(V-Sec.)$^{-1}$. See Shubert et al. at page 630.

Because the pseudomorphic InGaAs HEMTs of FIGS. 2C and 2D do not exhibit impurity scattering, the channel mobility of these devices should exceed that of the device 10. However, the mobility does not have a large effect on device performance and it now appears that HEMT performance is largely limited by the achievable electron density (approximately $4\times10^{12}$ cm$^{-2}$ for the double doped well of FIG. 2D) in the 2DEG layer. That is, the electron density in each InGaAs quantum well formed near the AlGaAs interface is limited by the conduction band gap between the heavily doped AlGaAs layer and the intrinsic InGaAs layer. By way of example, for $Al_xGa_{(1-x)}As$ (X=0.15, $N_D=2\times10^{18}$ cm$^{-3}$) the band gap is 0.3 eV and the corresponding 2DEG has a carrier density of approximately $2\times10^{12}$ cm$^{-2}$.

In contrast to the HEMT, a higher sheet carrier density is achievable in the pseudomorphic quantum well of the heterostructure device 10. The achievable electron density is confined to the maximum net n-type dopant concentration. That is, the carrier density is limited to approximately $10^{19}$ cm$^{-3}$, the level at which the impurity, e.g., Si, begins replacing As sites and functioning as a counterdopant.

Measurements indicate that the achievable carrier density in the InGaAs quantum well has a significant influence on transistor gain characteristics. Thus, for a short channel device, e.g., 0.25 $\mu$m gate, any detrimental effects of high dopant level impurity scattering on mobility are of lesser importance compared with the advantageous confinement of carriers to the relatively high mobility InGaAs layer 14.

Figure 3B:
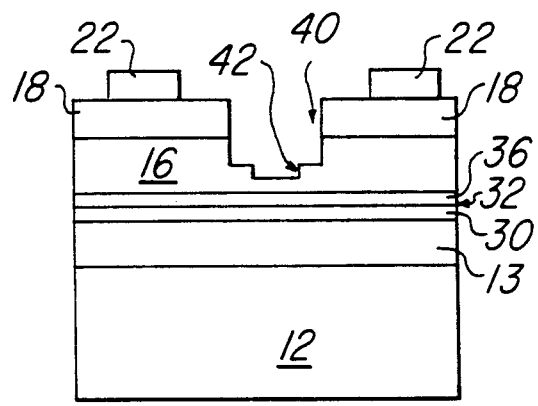

Further features of the device 10 are apparent from the following first preferred embodiment method of fabrication as illustrated in FIG. 3 (not drawn to scale) and beginning with a 600 μm thick semi-insulating GaAs substrate 12 having a planar surface along the <100> orientation on which there is epitaxially grown the undoped GaAs buffer layer 13 to a thickness of 1 μm. The pseudomorphic pulse doped layer 14 is then formed over the layer 13 by depositing a first 75 Å layer 30 of $In_xGa_{(1-x)}As$, X=0.15, followed by a Si deposition 32 of sufficient thickness, e.g., approximately 4 Å, to provide a density of $3 \times 10^{12}$ cm$^{-2}$. A second 75 Å layer 36 of $In_xGa_{(1-x)}As$, X=0.15, is formed over the Si deposition 32. Next a 2000 Å thick gate forming layer 16 of silicon doped GaAs (dopant concentration of $10^{17}$ cm$^{-3}$) is deposited over the second $In_xGa_{(1-x)}As$ layer 36 followed by a second 1000 Å thick silicon doped GaAs layer 18 (dopant concentration of $10^{18}$ cm$^{-3}$) to enhance ohmic contact with the subsequently formed source/drain electrodes 22. It is noted that with MBE, a 1 μm per hour growth rate and the relatively low, 500 to 600 C., temperature required for formation of the layers 14, 16 and 18 are sufficient to effect diffusion of the silicon deposition 32 into adjacent InGaAs layers 30 and 36, this resulting in the n+ pulse doped layer 26 of FIG. 1. Thus, although layer 32 is illustrated as a distinct layer in FIG. 3A, it will be understood by those skilled in the art that the layer 32 does not remain distinct. Rather, layer 32 diffuses into the adjoining layers as layers 36, 16 and 18 are subsequently grown.

At this point a first layer 38 of photoresist is spun over the second GaAs layer 18, masked and patterned. The active region of the device 10 is defined with a boron implant of $5 \times 10^{11}$ cm$^{-2}$ flux at an implant energy of 100 KeV. This is sufficient energy to penetrate into the buffer layer 13. The photoresist is then removed. Next a second layer of photoresist (not illustrated) is spun on to the layered structure and patterned to define source/drain regions on the heavily doped GaAs layer 18. With a standard E beam evaporation/liftoff technique gold:germanium/nickel/gold source/drain electrodes 22 are formed and then alloyed into the GaAs layer 18.

Next a first layer of PMMA is spun onto the layer 18 and patterned to define an opening for a one μm wide recessed gate region 40. The GaAs layer 18 is vertically etched 2,000 Å with $H_2SO_4:H_2O-2:H_2O$, i.e., about midway into the GaAs layer 16. The first layer of PMMA is removed and a second layer of PMMA is spun on and patterned to define a gate opening, concentric with the first region 40, for the second gate recess. Accordingly, the GaAs layer 16 is vertically etched an additional 700 Å to provide the intermediate structure of FIG. 3B. Then a titanium/platinum/gold multilayer gate 20 is deposited and patterned in the double recessed opening with a standard E beam evaporation/liftoff technique to provide the structure illustrated in FIG. 1. Subsequently a $Si_3N_4$ passivation layer is deposited overall. The underside of the GaAs substate 12 may be lapped down to a 100 μm thickness, metallized and bonded to a carrier.

ADVANTAGES AND MODIFICATIONS

Figure 4:
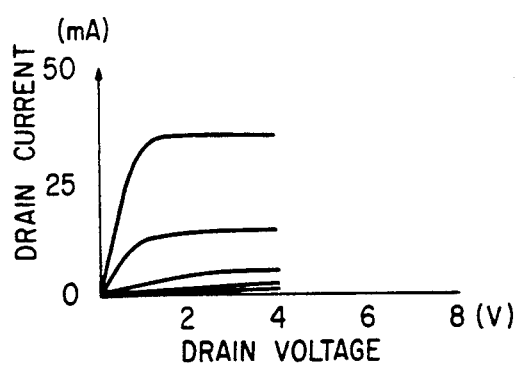
FIG. 4 illustrates the I-V characteristics for the heterostructure device of FIG. 1.
Figure 5:
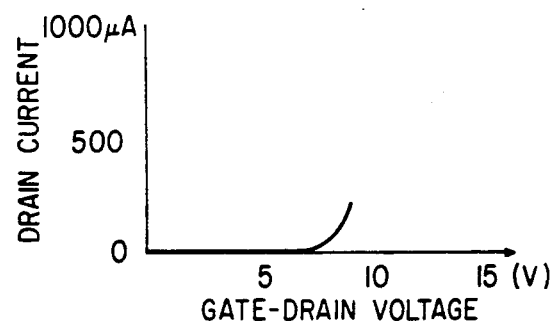
FIG. 5 presents the gate-drain reverse bias I-V curve for the device of FIG. 1.

FIG. 4 illustrates the I-V characteristics for the heterostructure device 10 and FIG. 5 presents the gate-drain reverse bias I-V curve. A peak transconductance of 520 mS/mm and a maximum current density of 700 mA/mm have been achieved. The breakdown voltage is in the range of 8 to 9 volts and the current cut off frequency, evaluated from s-parameter data, is near 55 GHz, which is significantly higher than that of a standard MESFET and comparable to that of a pseudomorphic HEMT. Thus, although the layer 14 is heavily doped, it is apparent from the invention that the transport properties of the device are not degraded.

Figure 6:
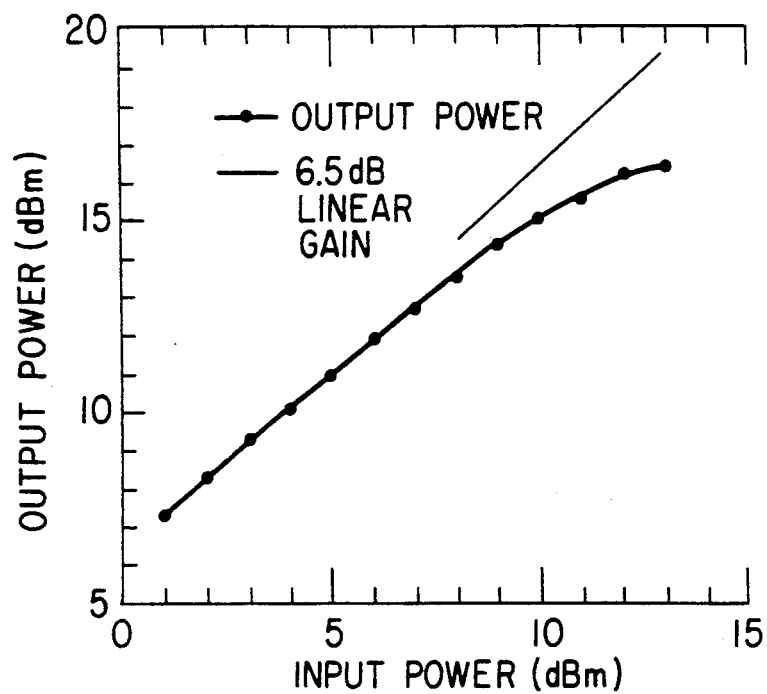
FIG. 6 illustrates the gain compression curve for the device of FIG. 1.

At 60 GHz the device 10 exhibits superior performance over the pseudomorphic HEMT. The small signal gain is 8 dB and a 0.6 W/mm power density has been achieved with 3.5 dB gain and 14% power added efficiency. FIG. 6 shows the gain compression curve for the device 10 having a 0.25 μm × 75 μm² gate.

Another feature of the invention is that the GaAs layer 16 comprises a relatively low dopant concentration thus providing improved Schottky gate properties over MESFETs formed with pulse doped GaAs layers as well as HEMT designs.

Various modifications of the preferred embodiment heterostructure device 10 and method of fabrication may be made while retaining advantageous features thereof. For example, the entire $In_xGa_{(1-x)}As$ layer 14 may be doped to form a 2DEG the width of the pseudomorphic layer. A uniform dopant distribution of $5 \times 10^{18}$ cm$^{-3}$ has been observed to provide a sheet carrier density comparable to that of the pulse doped heterostructure device 10 while providing equivalent performance.

Figure 7:
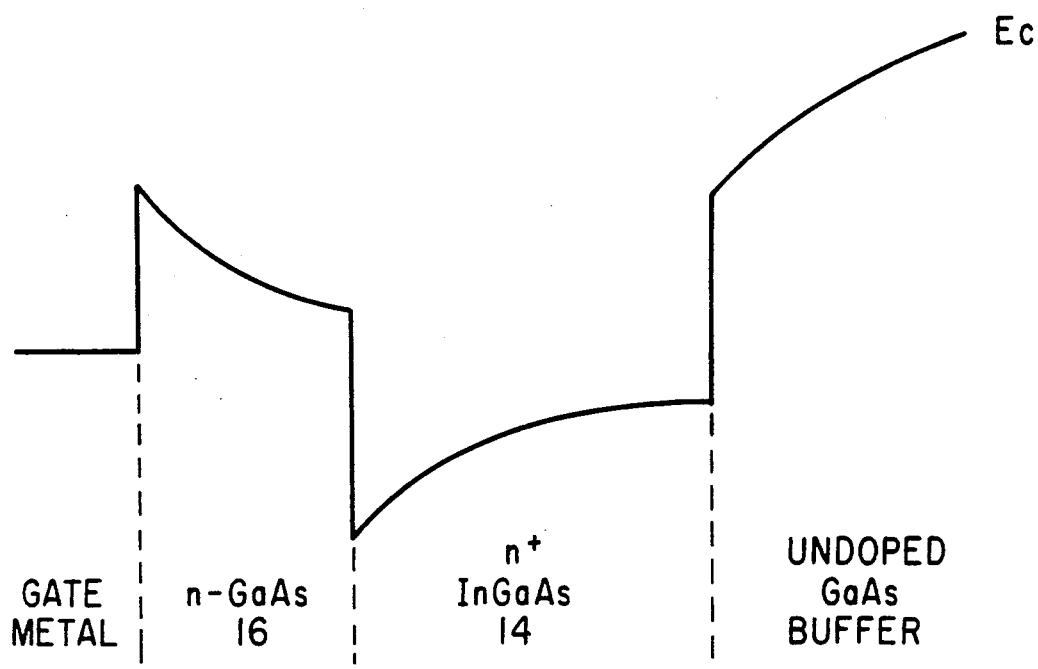
FIG. 7 is a conduction band diagram for a device having a uniformly doped conduction band layer.

The uniformly doped embodiment may be advantageous over the pulse doped structure in that it requires a simpler growth process. Furthermore, because net n-type dopant concentrations higher than $10^{18}$ cm$^{-3}$ can be provided throughout the layer 10, the uniformly doped device is expected to provide a higher current density than the pulse doped device. A conduction band diagram for the device 10 having a uniformly doped pseudomorphic layer 14 is illustrated in FIG. 7. Note the small perturbation in the InGaAs layer near the n-GaAs interface due to a slight HEMT effect.

As a further example, the $In_xGa_{(1-x)}As$ stoichiometry may be varied to provide a very large, e.g., up to X=0.5, mole fraction of Indium. This is believed to provide higher mobility in the active region. On the other hand, the increased Indium concentration will result in a greater lattice constant disparity, this possibly limiting the thickness of the pseudomorphic layer.

The semiconductor materials disclosed herein are exemplary of the compounds which may be used to form a high mobility high frequency heterostructure MESFET device. Other materials may be substituted. By way of example, the layer 16 may be formed of ZnSe and the InGaAs layer may be replaced with InAs, GaAs or HgCdTe. Other materials having a closer lattice match to InGaAs may be chosen for the substrate, e.g., InP. The doping levels may also be varied from those disclosed herein and p-type doping with 2 dimensional hole gases may be used with all embodiments and variations of the invention. Further enhancements are expected with modifications of the disclosed structure and the scope of the invention is limited only by the claims which follow.

We claim:
1. A MESFET comprising:
 (a) a semi-insulating region having a first buffer layer of a first compound semiconductor material along a surface thereof;

(b) a second region including a second compound semiconductor material different from said first compound semiconductor material, said second region including a central doped portion therein, said second region disposed over and contiguous with said buffer layer, said second region having a total thickness less that 250 Angstroms;

(c) a third region of compound semiconductor material disposed over said second region, the net dopant concentration in said second region exceeding the net dopant concentration is said third region; and (d) a fourth gate region positioned over said third region to provide a quantum well in said doped second region and a conduction channel region in said central doped portion.

2. The device of claim 1 wherein said gate region is recessed to offset surface change when forming a depletion region in said third semiconductor layer.

3. The device of claim 2 wherein said doped second region of second semiconductor material includes a total sheet carrier density of at least $10^{12}$ cm$^{-2}$.

4. The device of claim 2 wherein said region of second semiconductor material includes a pulse doped layer.

5. The device of claim 4 wherein the dopant concentration of said pulse doped layer is approximately $10^{19}$ cm$^{-3}$ and other portions of said region of second material are substantially undoped.

6. The device of claim 2 wherein said region of second material is pseudomorphic, elastically accommodating lattice mismatch with adjacent layers.

7. The device of claim 6 wherein said third region be formed of the same semiconductor material as the buffer layer.

8. The device of claim 2 wherein said buffer layer and said third region comprise GaAs and said region of second semiconductor material is formed of InGaAs.

9. The device of claim 8 wherein said InGaAs layer includes an n type pulse doped layer of $10^{19}$cm$^{-3}$ impurity concentration.

10. The device of claim 2 wherein said gate region is doubly recessed in said third layer.

11. The device of claim 1 wherein said buffer layer is undoped and said third region is doped.

12. The device of claim 4 wherein the pulse doped layer s approximately 50 Angstoms thick.

* * * * *